(12) United States Patent
Colla et al.

(10) Patent No.: US 11,958,284 B2
(45) Date of Patent: Apr. 16, 2024

(54) METHOD FOR SCREEN PRINTING OF A MATERIAL ON A SUBSTRATE, CONTROLLER FOR AN APPARATUS FOR SCREEN PRINTING ON A SUBSTRATE, AND APPARATUS FOR SCREEN PRINTING OF A MATERIAL ON A SUBSTRATE

(71) Applicant: APPLIED MATERIALS ITALIA S.R.L., San Biagio di Callalta (IT)

(72) Inventors: Davide Colla, Treviso (IT); Luigi De Santi, Spresiano (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 521 days.

(21) Appl. No.: 16/958,653

(22) PCT Filed: Dec. 27, 2017

(86) PCT No.: PCT/EP2017/084635
§ 371 (c)(1),
(2) Date: Jun. 26, 2020

(87) PCT Pub. No.: WO2019/129344
PCT Pub. Date: Jul. 4, 2019

(65) Prior Publication Data
US 2021/0060925 A1    Mar. 4, 2021

(51) Int. Cl.
*B41M 1/12*     (2006.01)
*B41F 15/08*    (2006.01)
(Continued)

(52) U.S. Cl.
CPC ........ *B41F 15/0818* (2013.01); *B41F 15/423* (2013.01); *B41F 15/46* (2013.01);
(Continued)

(58) Field of Classification Search
None
See application file for complete search history.

(56) References Cited

U.S. PATENT DOCUMENTS 4,063,502 A * 12/1977 Cunningham ........ B41F 15/423
101/128.1

FOREIGN PATENT DOCUMENTS

CA      1002828 A      1/1977
EP      2662905 A1    11/2013
(Continued)

OTHER PUBLICATIONS

English language translation of JP2006-321150A from EPO website. (Year: 2006).*

(Continued)

*Primary Examiner* — Leslie J Evanisko
(74) *Attorney, Agent, or Firm* — Patterson + Sheridan, LLP; B. Todd Patterson

(57) ABSTRACT

A method for screen printing of a material on a substrate is provided. The method includes moving a process head assembly having at least one deposition device from a first position to a second position to perform a stroke, wherein the stroke includes at least a first phase for material processing of a material on a screen device using the at least one deposition device and a second phase for a material transfer from the screen device to the substrate. The at least one deposition device moves in a first direction in the first phase. At least one device moves in a second direction perpendicular to the first direction in the first phase. The at least one deposition device and the at least one device simultaneously move during at least a part of the first phase. The at least one device is selected from the group including the at least one deposition device, a material processing device, the screen device, and a substrate support.

20 Claims, 5 Drawing Sheets

(51) Int. Cl.
*B41F 15/42* (2006.01)
*B41F 15/46* (2006.01)
*H01L 31/18* (2006.01)
*H05K 3/12* (2006.01)

(52) U.S. Cl.
CPC ............... *B41M 1/12* (2013.01); *H01L 31/18* (2013.01); *H05K 3/1216* (2013.01); *H05K 3/1233* (2013.01)

(56) References Cited

FOREIGN PATENT DOCUMENTS

| EP | 2881256 A1 | | 6/2015 | |
|---|---|---|---|---|
| JP | 2006321150 A | * | 11/2006 | |
| WO | WO-2017081297 A1 | * | 5/2017 | .......... B41F 15/0881 |

OTHER PUBLICATIONS

International Search Report and Written Opinion dated Nov. 7, 2018 for Application No. PCT/EP2017/084635.

* cited by examiner

METHOD FOR SCREEN PRINTING OF A MATERIAL ON A SUBSTRATE, CONTROLLER FOR AN APPARATUS FOR SCREEN PRINTING ON A SUBSTRATE, AND APPARATUS FOR SCREEN PRINTING OF A MATERIAL ON A SUBSTRATE

FIELD

Embodiments of the present disclosure relate to a method for screen printing of a material on a substrate, a controller for an apparatus for screen printing on a substrate, and an apparatus for screen printing of a material on a substrate. Embodiments of the present disclosure in particular relate to the manufacture of solar cells.

BACKGROUND

Solar cells are photovoltaic devices that convert sunlight directly into electrical power. Within this field, it is known to produce solar cells on a crystalline silicon base using deposition techniques, particularly printing techniques, achieving e.g. on the front surface of the solar cells a structure of selective emitters. A processing cycle can include at least one printing operation during which material is deposited on the substrate by a deposition device, and an optional further material processing operation. A productivity and/or throughput of the apparatus can be limited by a cycle time of the processing cycle.

In view of the above, new methods for screen printing of a material on a substrate, controllers for an apparatus for screen printing on a substrate, and apparatuses for screen printing of a material on a substrate, that overcome at least some of the problems in the art are beneficial. The present disclosure particularly aims at providing a method, a controller and an apparatus that can reduce a cycle time of a processing cycle to increase a productivity and/or a throughput.

SUMMARY

In light of the above, a method for screen printing of a material on a substrate, a controller for an apparatus for screen printing on a substrate, and an apparatus for screen printing of a material on a substrate are provided. Further aspects, benefits, and features of the present disclosure are apparent from the claims, the description, and the accompanying drawings.

According to an aspect of the present disclosure, a method for screen printing of a material on a substrate is provided. The method includes moving a process head assembly having at least one deposition device from a first position to a second position to perform a stroke, wherein the stroke includes at least a first phase for material processing of a material on a screen device using the at least one deposition device and a second phase for a material transfer from the screen device to the substrate. The at least one deposition device moves in a first direction in the first phase. At least one device moves in a second direction perpendicular to the first direction in the first phase. The at least one deposition device and the at least one device simultaneously move during at least a part of the first phase. The at least one device is selected from the group including the at least one deposition device, a material processing device, the screen device, and a substrate support.

According to a further aspect of the present disclosure, a controller for an apparatus for screen printing on a substrate is provided. The controller is configured to control a process head assembly having at least one deposition device to move from a first position to a second position to perform a stroke, wherein the stroke includes at least a first phase for material processing of a material on a screen device using the at least one deposition device and a second phase for a material transfer from the screen device to the substrate. The controller is further configured to move the at least one deposition device in a first direction in the first phase, and to move at least one device selected from the group including the at least one deposition device, a material processing device, the screen device, and a substrate support in a second direction perpendicular to the first direction in the first phase. The at least one deposition device and the at least one device are simultaneously moved during at least a part of the first phase.

According to another aspect of the present disclosure, an apparatus for screen printing of a material on a substrate is provided. The apparatus includes a process head assembly including at least one deposition device configured for transferring the material from a screen device to the substrate, and the controller according to the present disclosure.

Embodiments are also directed at apparatuses for carrying out the disclosed method and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

A processing cycle for forming conductive line patterns on a substrate can include at least one deposition process using a deposition device to deposit material on the substrate and optionally at least one further process using a material processing device. Before the deposition process and/or the further process can start, multiple devices such as a process head assembly having the deposition device and the material processing device, a screen device, and a substrate have to be brought into a relative alignment with respect to each other. The movements are time consuming and increase a printer cycle time, such that a productivity and/or throughput of the apparatus is reduced.

According to the present disclosure, certain movements, such as vertical movements of a deposition device, a material processing device, a screen device, and a substrate support, are hidden in at least a first phase for moving the deposition device to a start position for printing. A cycle time of the processing cycle can be reduced, and a productivity and/or throughput of the apparatus can be increased.

Figure 1:
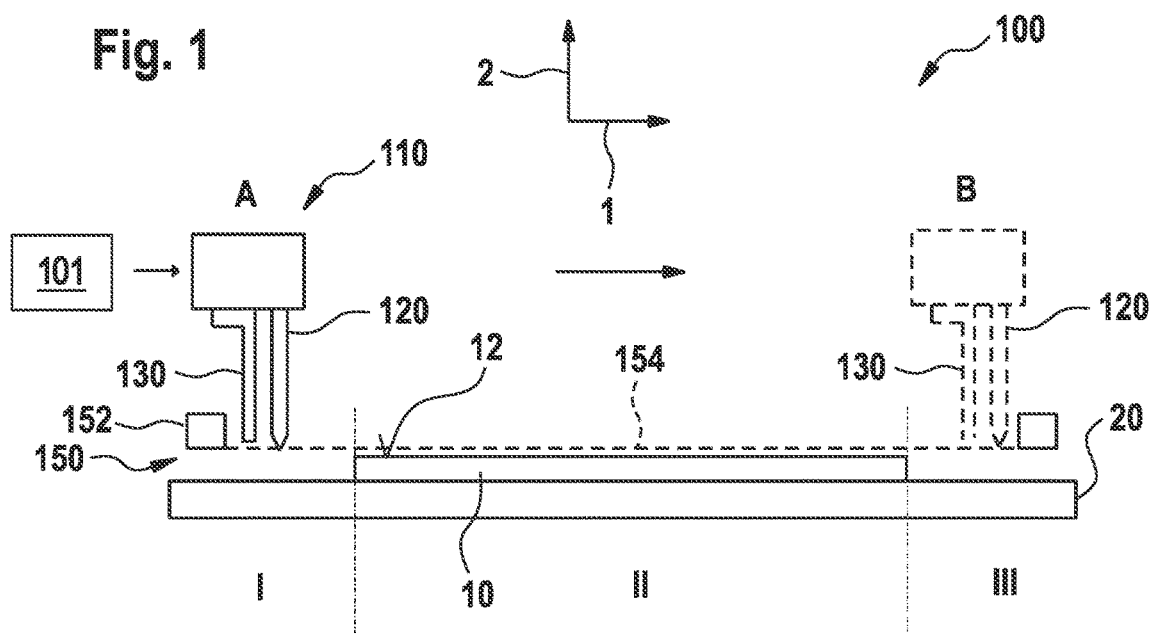
FIG. 1 shows a schematic view of an apparatus for screen printing of a material on a substrate used in the manufacture of a solar cell according to embodiments described herein.

FIG. 1 shows a schematic view of an apparatus 100 for screen printing of a material on a substrate 10 used in the manufacture of a solar cell according to embodiments described herein. The apparatus 100 is configured to perform the method for screen printing according to the present disclosure.

The apparatus 100 includes a process head assembly 110 having at least one deposition device 120, at least one material processing device 130, a screen device 150, and a substrate support 20, such as a printing nest. The substrate 10 is positioned on the substrate support 20, which can be a moveable substrate support such as a shuttle.

The screen device 150 can be arranged between the substrate 10 and/or the substrate support 20 and the process head assembly 110. The screen device 150 can include a frame 152 and a screen 154 attached to the frame 152. The screen 154 may include at least one of a net, a printing mask, a sheet, a metal sheet, a plastic sheet, a plate, a metal plate, and a plastic plate. In some embodiments, the screen 154 defines a pattern corresponding to a structure to be printed on the substrate, wherein the pattern may include at least one of holes, slots, incisions or other apertures. The pattern can correspond to the conductive line pattern to be printed on the substrate 10, such as fingers and/or busbars of the solar cell. For example, the screen 154 can have openings defining the conductive line pattern and a wire mesh provided within the openings.

The at least one deposition device 120 can be configured for transferring the material from the screen 154 to the substrate 10. The at least one material processing device 130 can be configured for material processing of a material on the screen 154. The material processing, which can also be referred to as "flooding" or "flood phase", can provide an essentially uniform layer of the material on the screen 154 which is to be transferred e.g. to a subsequent substrate that follows the processed substrate. In some embodiments, the deposition (or material transfer) process and the flooding can be performed sequentially, i.e., in two separate strokes. In further embodiments, the deposition (or material transfer) process and the flooding can be performed simultaneously, ie., in one single stroke.

According to some embodiments, a distance or spacing can be provided between the at least one deposition device 120 and the at least one material processing device 130. Specifically, the distance or spacing can be provided between adjacent or neighboring deposition devices and material processing devices. For example, the distance or spacing between a deposition device and an adjacent material processing device in the first direction 1 can be 50 mm or less, specifically 40 mm or less, and can more specifically be about 30 mm. The distance or spacing can provide room for accumulation of material ("paste roll").

In some embodiments, the at least one deposition device 120 is at least one printing device configured for transferring the material from the screen 154 to the substrate 10. The at least one printing device can include, or be, a squeegee. The squeegee can be configured to contact the screen 154 for printing. In some embodiments, a tip of the squeegee contacts the screen 154 and urges material to be printed onto the substrate 10 through the screen 154. The squeegee can be a diamond squeegee or an angled squeegee. The material can be a material suitable to form conductive line patterns, such as fingers and/or busbars, on a surface 12 of the substrate. For example, the material can be a paste, such as a silver paste.

The at least one material processing device 130 can be configured for processing of the material on the screen 154. According to some embodiments, which can be combined with other embodiments described herein, the at least one material processing device 130 is configured for providing an essentially uniform film of the material on the screen 154. In some implementations, the material processing can provide an optimal transfer of the material onto the substrate 10. Optionally or alternatively, the at least one material processing device 130 is configured for recovery of excess material on the substrate 10 and/or the screen 154. In some implementations, the at least one material processing devices 130 can be a flood bar. The material processing can be referred to as "flooding".

The process head assembly 110 is configured to perform a stroke, for example, between a first position A and a second position B. A distance between the first position A and the second position B can be equal to, or larger than, an extension of the substrate 10 or of the conductive line pattern such that the conductive line pattern or a layer thereof can be deposited on the substrate 10 during one stroke. In some implementations, the movement of the at least one screen printing head between the first position A and the second position B, such as the first stroke and/or the second stroke, can correspond to a stroke distance of 400 mm or less, specifically 300 mm or less, and more specifically 200 mm or less. For example, the stroke distance can be in a range of between 150 mm to 300 mm, and can specifically be about 220 mm. In some embodiments, the deposition (or material transfer) process and the flooding can be performed sequentially, i.e., in two separate strokes. In further embodiments, the deposition (or material transfer) process and the flooding can be performed simultaneously, ie., in one single stroke.

According to some embodiments, which can be combined with other embodiments described herein, the apparatus 100 includes a drive device (not shown) configured for moving the process head assembly 110 at least in the first direction 1 from the first position A to the second position B to perform the stroke. The first direction 1 can be a horizontal direction. The process head assembly 110 can be configured to perform the deposition/transferring and/or the flooding/ distributing of the material on the screen 154 during at least a portion of the movement from the first position A to the second position B.

The stroke includes a first phase I, a second phase II, and optionally a third phase III. The stroke having the first phase I, the second phase II, and the optional third phase III can be carried out for printing, i.e., a stroke to transfer the material from the screen 154 to the substrate 10. However, the present disclosure is not limited thereto, and the stroke having the first phase I, the second phase II, and the optional third phase III can be carried out for flooding, i.e., a stroke to distribute the material on the screen 154. In further embodiments, the stroke having the first phase I, the second phase II, and the optional third phase III can be carried out for a combined printing and flooding process. The combined flood movement during the deposition process can reduce a process time, such as a critical path time. As an example, the critical path time can be reduced by about one third.

The first phase I, the second phase II and the optional third phase III can be sequentially performed. According to some embodiments, the third phase III is configured essentially identically to the first phase I. The second phase II can be a phase for the actual transfer of the material from the screen 154 to the substrate 10. The first phase I can be a phase to bring at least one of the process head assembly 110, the at least one deposition device 120, the at least one material processing device 130, the screen device 150, the substrate 10 and the substrate support 20 into a start position for the actual transfer of the material to the substrate 10. The third phase III can be a phase right after the actual transfer of the material to the substrate 10. The first phase I (and the optional third phase III) can be a phase for material processing of a material on the screen 154 by the at least one deposition device 120. For example, the at least one deposition device can "roll" the material e.g. in the first phase I to provide an optimal interaction between the material and the at least one deposition device at the start of the actual transfer to the substrate 10 in the second phase II. The first phase and the optional third phase III can be referred to as "material-rolling phases". In some architectures with rotary tables, the first phase and the optional third phase III can be referred to as "squeegee IN/OUT".

According to some embodiments, which can be combined with other embodiments described herein, the first phase I (and optionally the third phase III) corresponds to a portion of the screen 154 of the screen device 150 having no apertures. The second phase II can correspond to a portion of the screen 154 having one or more apertures.

In some implementations, the process head assembly 110 moves in the first direction 1 during the entire first phase I, second phase II, and optional third phase III. For example, the process head assembly 110 moves only in the first direction 1 during the entire second phase II. Movements of at least one device of the apparatus 100 in the second direction 2, which can be a vertical direction, can be performed at least during the first phase I and the optional third phase III. In particular, vertical movements of the at least one device can be hidden during the movement of the process head assembly 110, such as a squeegee thereof in the horizontal direction. The at least one deposition device 120 and the at least one device can simultaneously move during at least a part of the first phase I and the optional third phase III in the first direction 1 and/or the second direction 2. The at least one device can be selected from the group including the at least one deposition device 120, the at least one material processing device 130, the screen device 150 (e.g. the frame 152), and the substrate support 20.

According to some embodiments, which can be combined with other embodiments described herein, the at least one deposition device contacts the screen 154 of the screen device 150 during the first phase I and the second phase II, and specifically during the entire first phase I and the second phase II. Optionally, the at least one deposition device contacts the screen 154 of the screen device 150 during the third phase III, and specifically during the entire third phase III. The material processing during the first phase I and the optional third phase III can provide an optimal rolling of the material, such as the paste, e.g. before the transfer, or printing, begins A quality of the line pattern deposited on the substrate 10 can be improved.

According to some embodiments, which can be combined with other embodiments described herein, the at least one deposition device 120 is simultaneously moved in the first direction 1 and the second direction 2 during the first phase I. The at least one deposition device 120 may move only in the first direction during the second phase II. For example, a vertical position of the at least one deposition device 120 can be kept constant during the second phase II.

According to some embodiments, which can be combined with other embodiments described herein, the substrate and at least a portion of the screen device 150 are moved with respect to each other during the first phase. For example, the frame 152 can move in the second direction 2 in the first phase I. The frame can be stationary in the second phase II.

According to some embodiments, which can be combined with other embodiments described herein, the substrate 10 is moved in the first phase I and/or the third phase III and is stationary in the second phase II. In other embodiments, the substrate 10 is stationary during the first phase I. For example, the substrate 10 and the screen device 150, specifically the frame 152, can be stationary during the first phase I. In some implementations, the at least one deposition device 120 and/or the screen device 150 are not in contact with the substrate 10 and/or the substrate support 20 during the first phase I.

In some embodiments, the apparatus 100 is configured for single printing, double printing, or multiple printing. For example, the conductive line pattern, such as the fingers and/or busbars of the solar cell, can include two or more material layers. A first material layer can be printed on the substrate 10 and a second material layer can be printed at least partially on top of the first material layer to form the conductive line pattern. In some implementations, the process head assembly 110 can print the first material layer during a first deposition process including the movement or first stroke from the first position A to the second position B. The process head assembly 110 can, in some embodiments, print the second material layer during a second deposition process including the movement or second stroke from the second position B to the first position A. However, the present disclosure is not limited thereto, and the deposition processes can be performed with the process head assembly 110 moving in the same direction, for example, the first direction 1.

According to some embodiments, which can be combined with other embodiments described herein, the first direction 1 is a horizontal direction and the second direction 2 is a vertical direction. The term "horizontal direction" is understood to distinguish over "vertical direction". That is, the "horizontal direction" relates to a substantially horizontal movement e.g. of the process head assembly 110, wherein a deviation of a few degrees, e.g. up to 1° or even up to 5°, from an exact horizontal direction is still considered as a "substantially horizontal direction". The vertical direction can be substantially parallel to the force of gravity.

According to an aspect of the present disclosure, the apparatus includes a controller 101. The controller 101 is configured to control a process head assembly 110 having at least one deposition device to move from a first position to a second position to perform a stroke, wherein the stroke includes at least a first phase for material processing of a material on a screen device using the at least one deposition device and a second phase for a material transfer from the screen device to the substrate. The controller 101 is further configured to move the at least one deposition device in a first direction in the first phase, and to move at least one device selected from the group including the at least one deposition device, a material processing device, the screen device, and a substrate support in a second direction perpendicular to the first direction in the first phase. The at least one deposition device and the at least one device are simultaneously moved during at least a part of the first phase.

According to embodiments described herein, the method for screen printing of a material on a substrate e.g. used in the manufacture of a solar cell can be conducted using computer programs, software, computer software products and the interrelated controllers, which can have a CPU, a memory, a user interface, and input and output devices being in communication with the corresponding components of the apparatus for deposition of a material on a substrate used in the manufacture of a solar cell.

Figure 2:
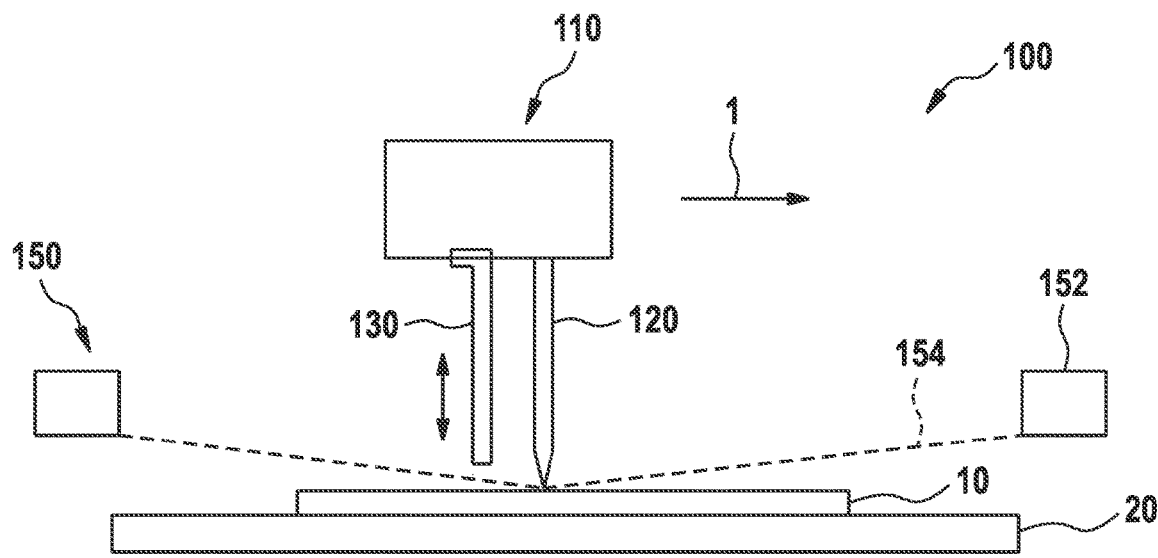
FIG. 2 shows a schematic view of an apparatus for screen printing of a material on a substrate used in the manufacture of a solar cell according to further embodiments described herein.

FIG. 2 shows a schematic view of the apparatus 100 for screen printing of a material on a substrate used in the manufacture of a solar cell according to further embodiments described herein.

According to some embodiments, which can be combined with other embodiments described herein, the distance (e.g., in the vertical direction) between the at least one material processing device 130 and the screen 154 and/or the substrate support 20 can be adjusted or controlled during the movement of the process head assembly 110 during at least one of the first phase, the second phase, and the third phase. For example, the distance can be adjusted by adjusting a vertical position of the at least one material processing device 130.

According to some embodiments, the distance between the at least one material processing device 130 and the screen 154 and/or the substrate support 20 can be adjusted to follow a screen profile. In particular, the vertical position of the at least one material processing device 130 can be controlled or adjusted to follow said screen profile. For example, the distance between the at least one material processing device 130 and the screen 154 and/or the substrate support 20 can be adjusted or controlled during the movement of the process head assembly 110 during the first phase, the second phase and the third phase so as to be essentially constant.

Figure 3:
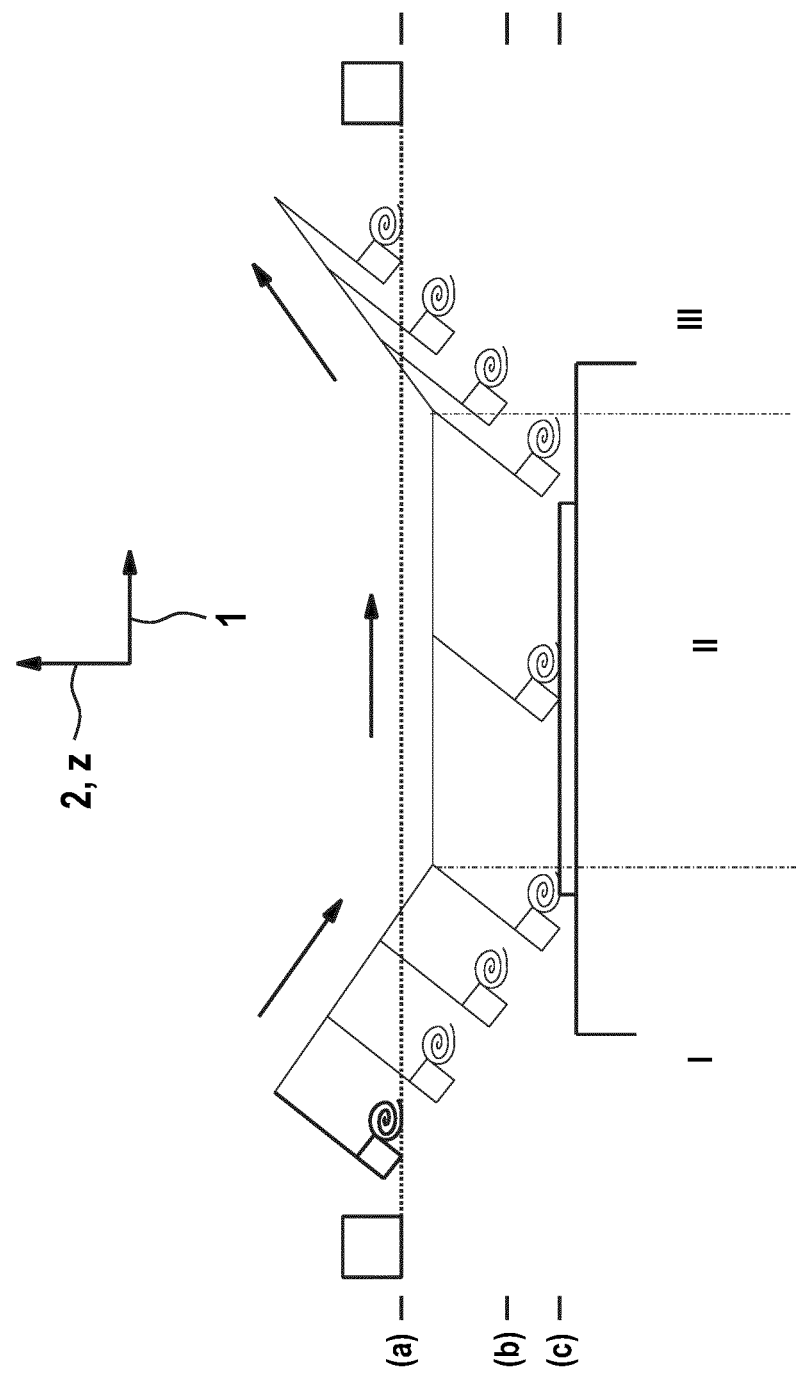
FIG. 3 shows a sequence of a method for screen printing of a material on a substrate according to embodiments described herein.

FIG. 3 shows an exemplary sequence of a method for screen printing of a material on a substrate according to embodiments described herein. In particular, a movement of the at least one deposition device, which is a squeegee, is shown for the first phase I, the second phase II, and the third phase III.

According to some embodiments, which can be combined with other embodiments described herein, the at least one deposition device is simultaneously moved in the first direction 1 and the second direction 2 during the first phase I. In some embodiments, the at least one deposition device moves only in the first direction 1 during the second phase II. The first direction can be a horizontal direction and the second direction 2 (or z-direction) can be a vertical direction.

IN FIG. 3, (a) indicates a park position of the screen device in the second direction 2. (b) indicates a snap off position of the screen device. (c) indicates a print position of the material deposition device. The screen device is only illustrated for the park position.

The squeegee is in contact with the screen during the first phase I, the second phase II, and the third phase III. The vertical movements of the screen device and the squeegee are hidden in the horizontal movement of the squeegee in the first phase I and the third phase III. A fully automatic interpolation can be used, wherein all movements, such as z-up/down, up/down of the squeegee, and in/out of the squeegee, are overlapped. A smaller deflection of the screen can be provided. Further, an optimal positioning of the squeegee and floodbar and an optimal rolling of the paste can be achieved.

Figure 4:
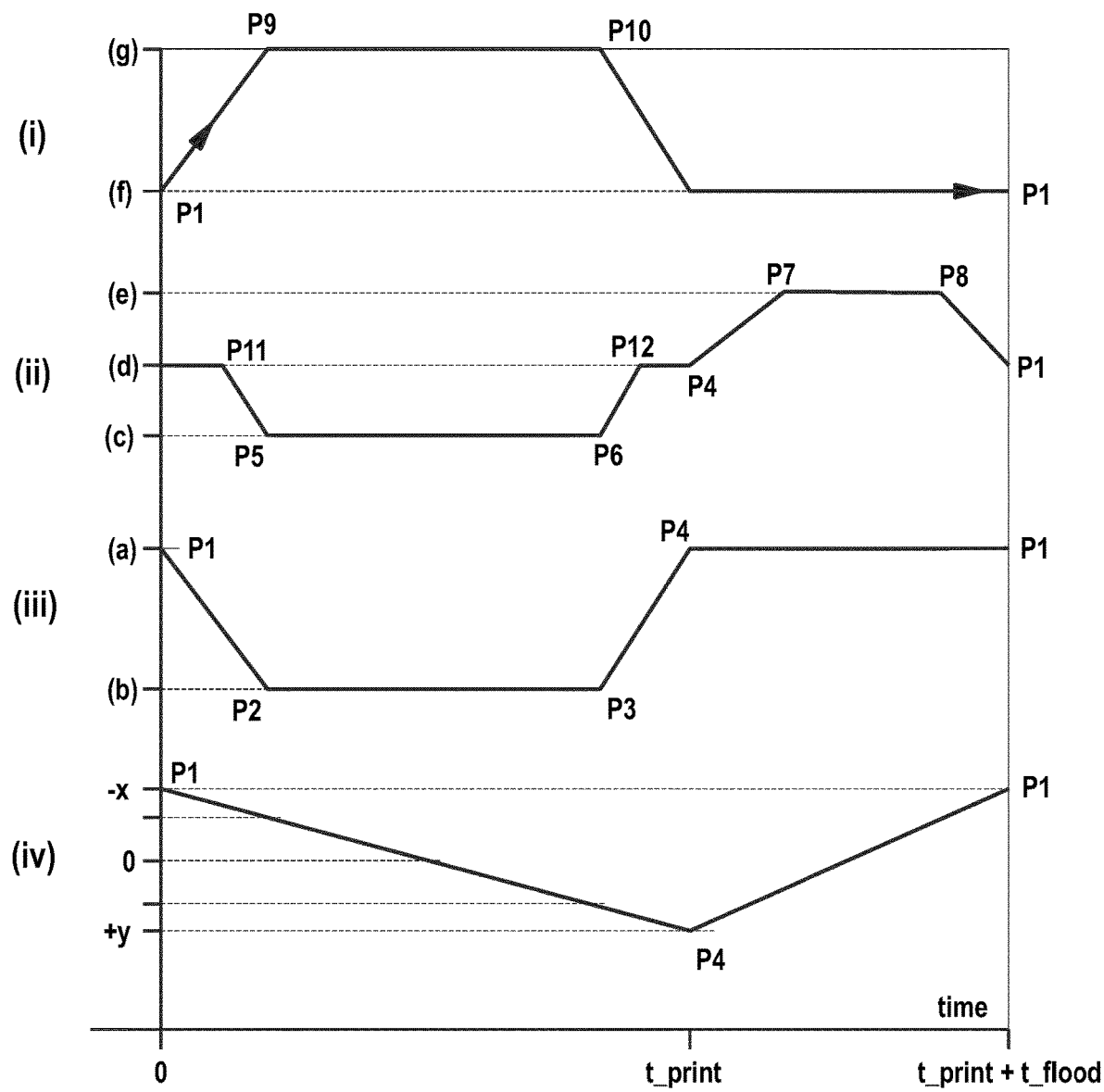
FIG. 4 shows a chart of movements according to embodiments described herein.
Figure 5:
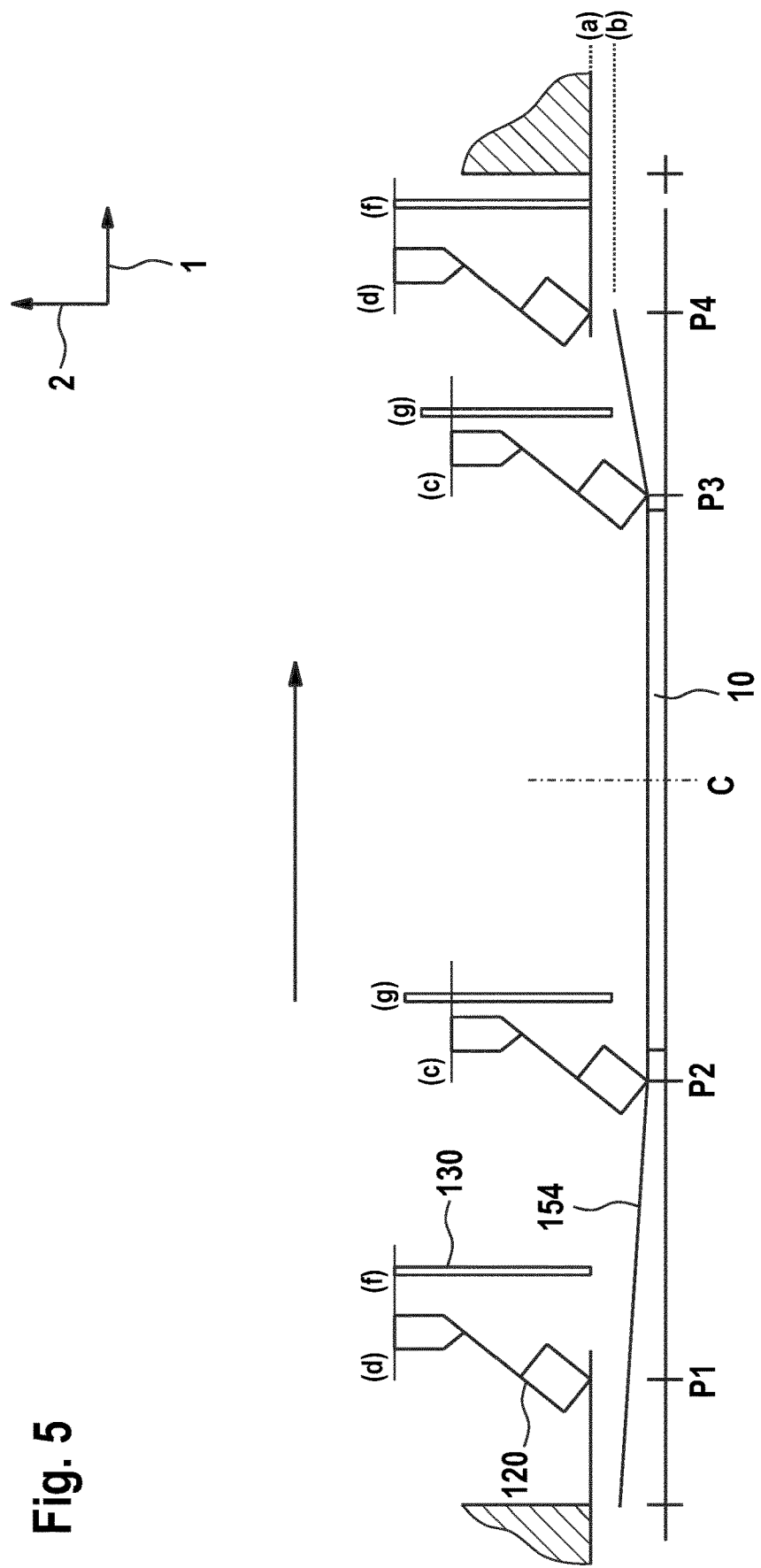
FIG. 5 shows a sequence of a method for screen printing of a material on a substrate according to further embodiments described herein.

FIG. 4 shows a chart of movements (i) to (iv) according to embodiments described herein. FIG. 5 shows a sequence of a method for screen printing of a material on a substrate based on the chart of FIG. 4. P1 to P12 indicate points at which movements of the devices begin, end, or change.

In FIG. 4, (a) indicates a screen park position, (b) indicates a screen snap-off position, (c) indicates a material deposition device printing position, (d) indicates a material deposition device rolling position, (e) indicates a material deposition device park position, (f) indicates a material processing device flooding position, and (g) indicates a material processing device park position. Corresponding positions have been indicated in FIG. 5. −x=P1 may indicate the start of the printing stroke. +y=P4 may indicate the end of the printing stroke. In some embodiments, certain positions may coincide, such as P1=P11 and/or P12=P4.

FIG. 4 illustrates a movement (i) of the at least one material processing device, such as the floodbar, in the first direction which is a vertical direction. The flood up/down axis, which can be driven by a linear motor, can control the vertical position of the flood blade in reference to the frame of the screen device. The lowest position can be referred to as "flooding position". The upwards movement starts at a point when the print begins (start of the first phase). The flood may stay in a range of between 0 and 2 mm or, specifically, between 0 and 1 mm or, more specifically, between 0 and 0.5 mm e.g. along about 75% of the flooding stroke, or, specifically, about 90% or, more specifically, about 100%.

Further, a movement (ii) of the at least one deposition device, such as the squeegee, in the first direction is shown. The squeegee up/down axis, which can be driven by a linear motor, can control the vertical position of the squeegee in reference to the frame of the screen device. The lowest position can be referred to as "printing position", which can be a position for printing in contact with the cell. According to some embodiments, the upwards movement can be carried out in a single step. However, the present disclosure is not limited thereto, and the deposition device can move over a two or more, such as three, different positions.

FIG. 4 further shows a movement (iii) of the screen device, such as the frame, in the first direction. The printer z-axis, which can be driven by a ball screw and a brushless motor, can control the vertical position of the frame in reference to the printing nest. In particular, the printer z-axis can change the vertical distance between the nest and the screen frame. The lowest position can be referred to as "snap off position", which can be a position for printing.

The movement pattern of the present disclosure can be used in combination with a variety of architectures, such as rotary table architectures and linear-shuttle architectures. Depending on the architecture, the vertical distance between the nest and the screen may be changed by a movement of the nest.

Further, a movement (iv) of the at least one deposition device, such as the squeegee, in the second direction which can be a horizontal direction is shown. The squeegee in/out axis, which can be driven by a linear motor, can control the horizontal position of the squeegee in reference to the center C of the cell (see FIG. 5; may be consistent with the center of the screen and/or the center of the solar cell). For example, a 220 mm stroke can be carried out from −110 mm to +110 mm to deposit the paste on the cell or from −120 to +100 mm depending on the design of the deposition and processing devices mounted on the printer head.

Optionally, the movements can include a rotation of a rotary table. In particular, the nest with the wafer can be moved from a load position to a printing position. As illustrated in the above movements (i) to (iv), all vertical movements (z-axis, squeegee up/down, flood up/down) are hidden during the squeegee stroke, i.e., the first phase and the third phase.

Turning now to FIG. 5, a printing movement is shown. The dashed vertical line indicates the center of the substrate/cell. The squeegee is on the screen all over the stroke. The squeegee and screen descend and lift at the same time keeping the contact (interpolation). The squeegee lifts during the flooding and returns onto the screen at the end of the flood. The roll of paste is moved smoothly by the squeegee at the beginning and the end of the stroke, ie., in the first phase and the second phase, respectively. Printing conditions are optimal along the wafer area.

The movement pattern of the present disclosure may be implemented in various architectures, such as such as rotary table architectures and linear-shuttle architectures.

According to some embodiments, which can be combined with other embodiments described herein, the method according to the present disclosure can simultaneously perform the deposition of the material on the substrate and the material processing using one or more deposition devices and one or more material processing devices, respectively. For example, the deposition and material processing can be done during the same stroke or movement of the screen printing head. A cycle time of the processing cycle can be reduced, and a productivity and/or throughput of the apparatus can be increased. In particular, a layer of the material can be provided on a screen. The material can be transferred from the screen to the substrate using the deposition device, which can be a squeegee. The material processing device can follow the deposition device and provide another layer of the material on the screen for deposition on e.g. a subsequent substrate.

According to some embodiments, which can be combined with other embodiments described herein, the present disclosure can use a transport device, such as a rotary table, for transportation of the cell input from a linear transport lane to a printing position. The printing direction can be parallel to a transport direction of the linear transport lane of the cells. In particular, the deposition device can move essentially parallel to a linear transport direction of the substrate rather than perpendicular to the linear transport direction. A throughput can be increased. Such a configuration can in particular increase the throughput for heterojunction cells e.g. by additionally implementing the aforementioned "concurrent printing process", in which the deposition of the material on the substrate and the material processing is performed simultaneously.

Figure 6:
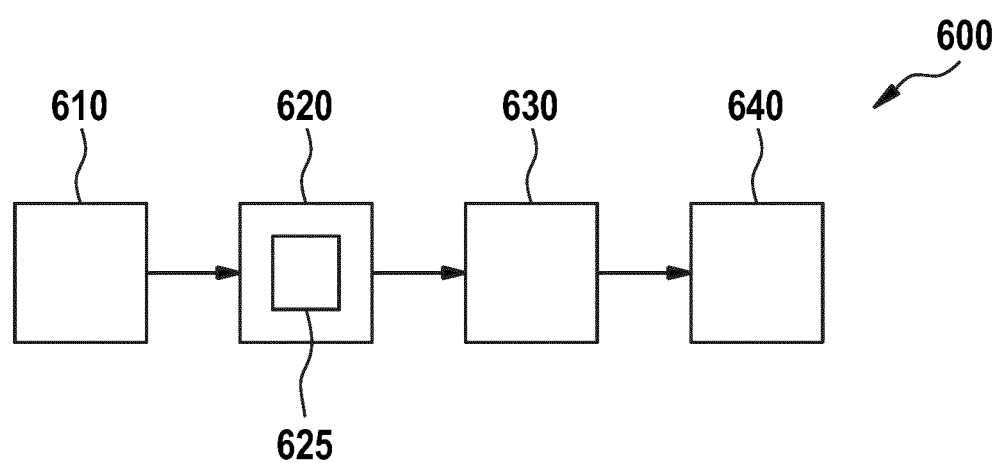
FIG. 6 shows a schematic view of a solar cell production apparatus according to embodiments described herein.

FIG. 6 shows a schematic view of a solar cell production apparatus 600 according to embodiments described herein.

The solar cell production apparatus 600 includes one or more deposition stations 620 and the apparatus 625 for screen printing of a material on a substrate used in the manufacture of a solar cell according to the embodiments described herein. The apparatus 625 can be provided in at least one deposition station of the one or more deposition stations 620.

The solar cell production apparatus 600 can include one or more further stations upstream and/or downstream of the one or more deposition stations 620. For example, the solar cell production apparatus 600 can include a first inspection station 610 for inspection of the substrates to be input into the one or more deposition stations 620. The solar cell production apparatus can include a drying station 630 for drying of the material deposited on the substrates in the one or more deposition stations 620. In some embodiments, the solar cell production apparatus 600 can include a second inspection station 640 for inspection of the conductive line patterns deposited on the substrates in the one or more deposition stations 620.

The solar cell production apparatus 600, and particularly the one or more deposition stations 620 having the apparatus according to the present disclosure, can be part of a larger production system for producing solar cells, such as an in-line production system.

According to the present disclosure, certain movements, such as vertical movements of a deposition device, a material processing device, a screen device, and a substrate support, are hidden in a first phase for moving the deposition device to a start position for printing. A cycle time of the processing cycle can be reduced, and a productivity and/or throughput of the apparatus can be increased.

The present disclosure provides the following aspects and advantages: •Performing the optimal action of the squeegee on the paste roll by moving on and in contact with the screen during the movements of the printer z-axis. •The printer z-axis UP/DOWN, squeegee stroke, squeegee UP/DOWN, flood bar UP/DOWN are operated concurrently •The squeegee begins the printing stroke in a position of being on and in contact with the screen •The squeegee remains in on and in contact with the screen all over the printing stroke •The squeegee and screen descend and lift concurrently keeping contact with each other using automatic interpolation •The squeegee lifts at the beginning of the flooding phase and returns in contact with the screen at the end of the flooding phase •The movement is approximately symmetric with respect to the wafer (beginning/end of the printing stroke).

While the foregoing is directed to embodiments of the disclosure, other and further embodiments of the disclosure may be devised without departing from the basic scope thereof, and the scope thereof is determined by the claims that follow.

The invention claimed is:

1. A method for screen printing of a material on a substrate, comprising:
    moving a process head assembly having at least one deposition device from a first position to a second position to perform a stroke, wherein the movement of the process head assembly from the first position to the second position to perform the stroke includes at least a first phase for material processing of a material on a screen device using the at least one deposition device and a second phase for a material transfer from the screen device to the substrate, wherein in the first phase the material is moved by the at least one deposition device before the material transfer begins;

wherein the at least one deposition device moves in a first direction in the first phase;

wherein at least one device moves in a second direction perpendicular to the first direction in the first phase;

wherein the at least one deposition device and the at least one device simultaneously move during at least a part of the first phase; and wherein the at least one device is selected from the group consisting of the at least one deposition device, a material processing device, the screen device, and a substrate support.

2. The method of claim 1, wherein the first direction is a horizontal direction and the second direction is a vertical direction.

3. The method of claim 1, wherein the at least one deposition device is simultaneously moved in the first direction and the second direction during the first phase, and wherein the at least one deposition device moves only in the first direction during the second phase.

4. The method of claim 1, wherein the substrate and at least a portion of the screen device are moved with respect to each other during the first phase.

5. The method of claim 1, wherein the screen device comprises a frame and a screen attached to the frame, and wherein the frame is stationary in the second phase.

6. The method of claim 5, wherein the frame moves in the second direction in the first phase.

7. The method of claim 1, wherein the substrate is moved in the first phase and is stationary in the second phase.

8. The method of claim 1, wherein the substrate and the screen device are stationary during the first phase.

9. The method of claim 1, wherein the at least one deposition device contacts a screen of the screen device during the first phase and the second phase.

10. The method of claim 1, wherein at least one of the at least one deposition device or the screen device are not in contact with at least one of a substrate or a substrate support during the first phase.

11. The method of claim 1, wherein the first phase corresponds to a portion of a screen of the screen device having no apertures, and wherein the second phase corresponds to a portion of the screen having one or more apertures.

12. The method of claim 1, wherein the stroke includes a third phase for material processing of the material on the screen device, and wherein the first phase, the second phase and the third phase are sequentially performed.

13. The method of claim 12, wherein one or more movements of the at least one deposition device and the at least one device performed in the first phase are also performed in the third phase.

14. The method of claim 1, wherein the substrate is a substrate used in the manufacture of a solar cell.

15. A controller for an apparatus for screen printing on a substrate, configured to:

control a process head assembly having at least one deposition device to move from a first position to a second position to perform a stroke, wherein the movement of the process head assembly from the first position to the second position to perform the stroke includes at least a first phase for material processing of a material on a screen device using the at least one deposition device and a second phase for a material transfer from the screen device to the substrate wherein in the first phase the material is moved by the at least one deposition device before the material transfer begins;

move the at least one deposition device in a first direction in the first phase; and move at least one device selected from the group consisting of the at least one deposition device, a material processing device, the screen device, and a substrate support in a second direction perpendicular to the first direction in the first phase; wherein the at least one deposition device and the at least one device are simultaneously moved during at least a part of the first phase.

16. The controller of claim 15, wherein the first direction is a horizontal direction and the second direction is a vertical direction.

17. The controller of claim 15, wherein the at least one deposition device is simultaneously moved in the first direction and the second direction during the first phase, and wherein the at least one deposition device moves only in the first direction during the second phase.

18. The controller of claim 15, wherein the substrate and at least a portion of the screen device are moved with respect to each other during the first phase.

19. The controller of claim 15, wherein the screen device comprises a frame and a screen attached to the frame, and wherein the frame is stationary in the second phase.

20. An apparatus for screen printing of a material on a substrate, comprising:

a process head assembly including at least one deposition device configured for transferring the material from a screen device to the substrate; and the controller of claim 15.

* * * * *